United States Patent
Iizuka et al.

(10) Patent No.: US 9,653,262 B2
(45) Date of Patent: May 16, 2017

(54) METHOD OF MEASURING BEAM POSITION OF MULTI CHARGED PARTICLE BEAM, AND MULTI CHARGED PARTICLE BEAM WRITING APPARATUS

(71) Applicant: NuFlare Technology, Inc., Yokohama (JP)

(72) Inventors: Osamu Iizuka, Yokohama (JP); Kenji Ohtoshi, Kawasaki (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 14/823,015

(22) Filed: Aug. 11, 2015

(65) Prior Publication Data

US 2016/0086764 A1    Mar. 24, 2016

(30) Foreign Application Priority Data

Sep. 19, 2014  (JP) ................................. 2014-191659

(51) Int. Cl.
  *H01J 37/04*   (2006.01)
  *H01L 21/027*  (2006.01)
  (Continued)

(52) U.S. Cl.
  CPC ...... *H01J 37/3177* (2013.01); *H01J 37/3045* (2013.01); *H01J 2237/3045* (2013.01); *H01J 2237/30438* (2013.01)

(58) Field of Classification Search
  CPC .. H01J 37/3177; H01J 37/3174; H01J 37/045; H01J 37/3045; H01J 37/3026;
  (Continued)

(56) References Cited

U.S. PATENT DOCUMENTS 4,431,923 A * 2/1984 Wang .................. G03F 7/70375
                                                 250/491.1
5,384,463 A * 1/1995 Honjo ...................... G03F 1/86
                                                 250/396 R
(Continued)

FOREIGN PATENT DOCUMENTS

JP      2006-245096      9/2006

*Primary Examiner* — David A Vanore
(74) *Attorney, Agent, or Firm* — Oblon, McClelland, Maier & Neustadt, L.L.P.

(57) ABSTRACT

A method of measuring beam positions of multi charged particle beams includes acquiring a number of multi charged particle beams needed for the measurement reproducibility of a current amount to be within the range of an allowable value. The method further includes setting measurement points depending on a desired dimensional accuracy value in an irradiation region irradiated by the whole of the multi charged particle beams, and setting, for each of a plurality of measurement points, a beam region, including a measurement point of measurement points irradiated by a plurality of beams whose number is the number of beams needed for the measurement reproducibility in the multi charged particle beams. Further, the method includes measuring, for each of a plurality of measurement points, the position of a measurement point concerned in a plurality of measurement points by using a plurality of beams of a corresponding beam region.

10 Claims, 10 Drawing Sheets

(51) Int. Cl.
*H01J 37/317* (2006.01)
*H01J 37/304* (2006.01)

(58) Field of Classification Search
CPC ...... H01J 37/304; H01J 37/073; H01J 37/265; H01J 37/3005; H01J 37/3023
USPC .............. 250/396 R, 298, 492.3, 397, 491.1, 250/492.22, 306, 311, 396 ML, 400, 250/492.2, 492.21
See application file for complete search history.

(56) References Cited

U.S. PATENT DOCUMENTS

| | | | | |
|---|---|---|---|---|
| 6,943,351 B2* | 9/2005 | Parker | ................... | H01J 37/065 250/306 |
| 7,423,274 B2* | 9/2008 | Nakayama | ............. | B82Y 10/00 250/491.1 |
| 9,141,750 B2* | 9/2015 | Yashima | ............. | G06F 17/5081 |
| 9,147,553 B2* | 9/2015 | Nishimura | ......... | H01J 37/3174 |
| 9,190,245 B2* | 11/2015 | Motosugi | ............ | H01J 37/3174 |
| 9,275,824 B2* | 3/2016 | Matsumoto | ......... | H01J 37/3177 |
| 9,299,533 B2* | 3/2016 | Matsumoto | ......... | H01J 37/3007 |
| 9,299,535 B2* | 3/2016 | Ogasawara | ........... | H01J 37/045 |
| 2006/0197453 A1 | 9/2006 | Nakayama et al. | | |
| 2009/0224170 A1* | 9/2009 | Yamazaki | ............. | H01J 37/244 250/397 |
| 2010/0187433 A1* | 7/2010 | Eastham | ................ | B82Y 15/00 250/396 R |
| 2013/0252172 A1* | 9/2013 | Matsumoto | ......... | H01J 37/3177 430/296 |
| 2013/0320230 A1* | 12/2013 | Yoshikawa | ......... | H01J 37/3177 250/398 |
| 2014/0175302 A1* | 6/2014 | Touya | .................... | B82Y 40/00 250/398 |
| 2014/0203185 A1* | 7/2014 | Nakayama | .......... | H01J 37/3174 250/397 |
| 2014/0367584 A1* | 12/2014 | Matsumoto | ........... | H01J 37/304 250/396 R |
| 2015/0235807 A1* | 8/2015 | Matsumoto | ......... | H01J 37/3177 250/492.2 |
| 2015/0255249 A1* | 9/2015 | Ogasawara | ......... | H01J 37/3177 250/396 R |
| 2016/0086764 A1* | 3/2016 | Iizuka | ................. | H01J 37/1472 250/400 |
| 2016/0093466 A1* | 3/2016 | Mizoguchi | ............ | H01J 37/244 315/14 |

* cited by examiner

… (1)

METHOD OF MEASURING BEAM POSITION OF MULTI CHARGED PARTICLE BEAM, AND MULTI CHARGED PARTICLE BEAM WRITING APPARATUS

CROSS-REFERENCE TO RELATED APPLICATION

This application is based upon and claims the benefit of priority from the prior Japanese Patent Application No. 2014-191659 filed on Sep. 19, 2014 in Japan, the entire contents of which are incorporated herein by reference.

BACKGROUND OF THE INVENTION

Field of the Invention

Embodiments of the present invention relate generally to a method of measuring beam positions of multi charged particle beams, and a multi charged particle beam writing apparatus, and more specifically, for example, relate to a method of measuring a beam position in multi beam writing.

Description of Related Art

In recent years, with high integration of LSI, the line width (critical dimension) of circuits of semiconductor devices is becoming progressively narrower. As a method for forming an exposure mask (also called a reticle) used to form circuit patterns on these semiconductor devices, the electron beam (EB) writing technique having excellent resolution is employed.

As an example employing the electron beam writing technique, a writing apparatus using multi-beams can be cited. Compared with the case of writing a pattern by using a single electron beam, since it is possible to emit multiple beams at a time (one shot) in multi-beam writing, the throughput can be greatly increased. For example, in a writing apparatus employing a multi-beam system, multi-beams are formed by making portions of an electron beam emitted from an electron gun pass through a corresponding hole of a plurality of holes formed in the mask, blanking control is performed for each beam, and each unblocked beam is reduced by an optical system and deflected by a deflector so as to irradiate a desired position on a target object or "sample".

Now, regarding the beam position, since the beam position of multi-beams directly affects writing dimensions, it is important to accurately know the beam positions of multi-beams in order to maintain the dimensional accuracy of multi-beam writing. However, since the amount of current per beam used for multi-beam writing is small and its signal strength is weak, there is a problem in that the measurement accuracy decreases in measuring each beam, and therefore it is difficult to highly accurately measure beam positions of multi-beams. Accordingly, in the method described above, it has been difficult to correctly and accurately know beam positions of multi-beams. Moreover, since the number of beams configuring multi-beams is very large, there is also a problem in that it takes a long time to measure positions of all the multi-beams.

Regarding the multi-beam technique, there is disclosed a technique in which, when measuring a deflection sensitivity of main-sub two-stage deflection, positions are measured by scanning marks having a periodic structure with a beam pitch, by using beamlets configured by a plurality of beams (e.g., refer to Japanese Patent Application Laid-open (JP-A) No. 2006-245096).

BRIEF SUMMARY OF THE INVENTION

According to one aspect of the present invention, a method of measuring beam positions of multi charged particle beams includes acquiring a number of beams of multi charged particle beams, needed for a measurement reproducibility of a current amount to be within a range of an allowable value, setting a plurality of measurement points depending on a desired dimensional accuracy value, in an irradiation region irradiated with a whole of the multi charged particle beams, setting, for each of the plurality of measurement points, a beam region, including a measurement point of the plurality of measurement points, irradiated by a plurality of beams whose number is the number of beams needed for the measurement reproducibility in the multi charged particle beams, and measuring, for the each of the plurality of measurement points, a position of a measurement point concerned in the plurality of measurement points by using the plurality of beams of a corresponding beam region.

According to another aspect of the present invention, a multi charged particle beam writing apparatus includes a stage configured to mount a target object thereon and to be continuously movable, an emitter configured to emit a charged particle beam, an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings, a blanking plate in which there are arranged a plurality of blankers configured to respectively perform blanking deflection for a corresponding beam of the multiple beams having passed through the plurality of openings of the aperture member, a blanking aperture member configured to block each beam having been deflected to be in an "off" state by at least one of the plurality of blankers, an acquisition unit configured by at least one circuit, to acquire a number of beams needed for a measurement reproducibility of a current amount of multi charged particle beams to be within a range of an allowable value, a measurement point setting unit configured by the at least one circuit, to set a plurality of measurement points depending on a desired dimensional accuracy value, in an irradiation region irradiated with a whole of the multi charged particle beams, a beam region setting unit configured by the at least one circuit, to set, for each of the plurality of measurement points, a beam region, including a measurement point of the plurality of measurement points, configured by a plurality of beams whose number is the number of beams needed for the measurement reproducibility in the multi charged particle beams, and a measurement unit configured by the at least one circuit, to measure, for the each of the plurality of measurement points, a position of a measurement point concerned in the plurality of measurement points by using the plurality of beams of a corresponding beam region.

DETAILED DESCRIPTION OF THE INVENTION

First Embodiment

In the first embodiment, there will be described a method and apparatus for measuring beam positions of multi charged particle beams that can measure beam positions of multi-beams within a shorter time, while satisfying required measurement accuracy and dimensional accuracy.

In the first embodiment, there will be described a configuration in which an electron beam is used as an example of a charged particle beam. The charged particle beam is not limited to the electron beam, and other charged particle beam such as an ion beam may also be used.

Figure 1:
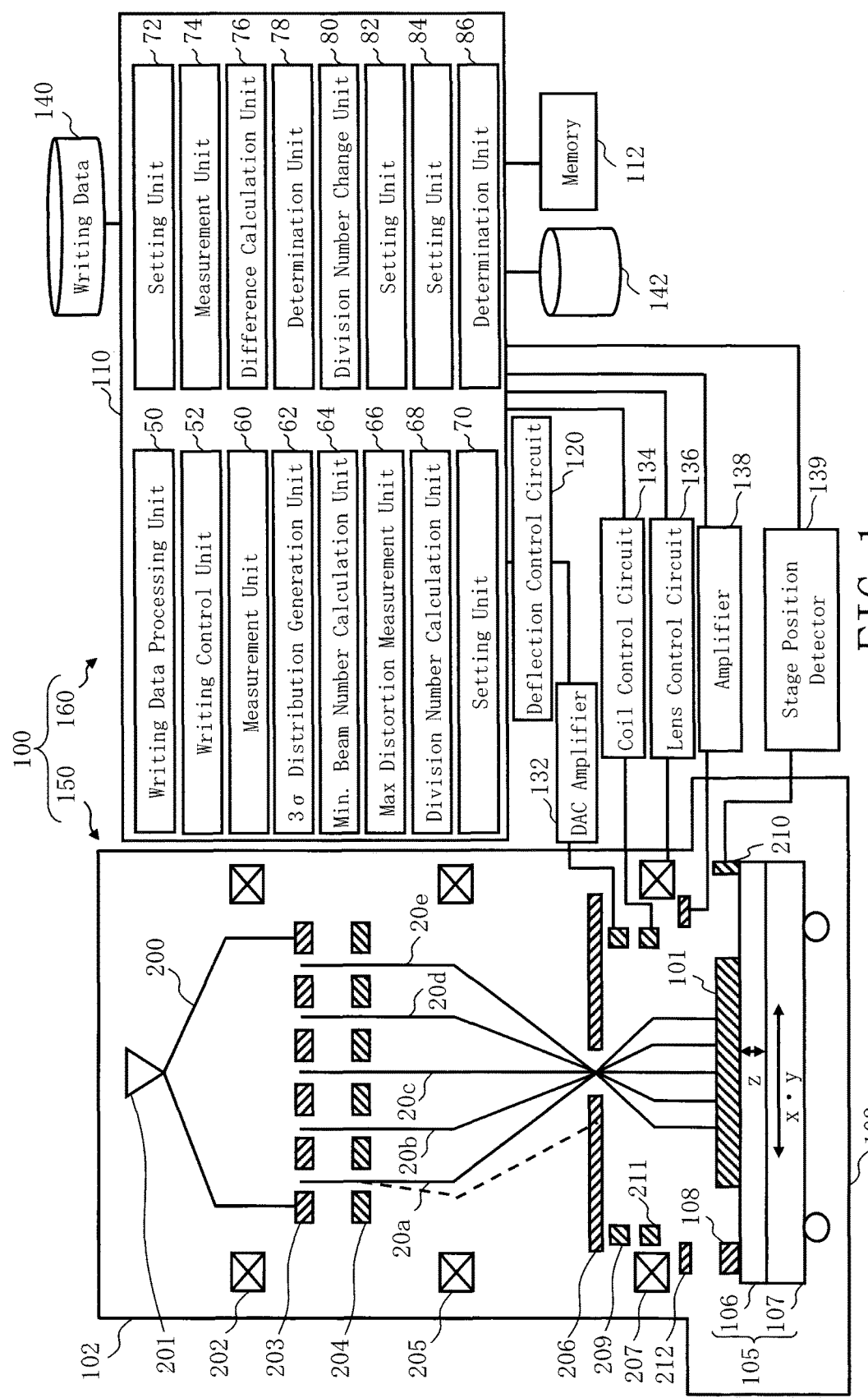
FIG. 1 is a schematic diagram showing a configuration of a writing apparatus according to a first embodiment.

FIG. 1 is a schematic diagram showing a configuration of a writing or "drawing" apparatus according to the first embodiment. In FIG. 1, a writing apparatus 100 includes a writing unit 150 and a control unit 160. The writing apparatus 100 is an example of a multi charged particle beam writing apparatus. The writing unit 150 includes an electron optical column 102 and a writing chamber 103. In the electron optical column 102, there are arranged an electron gun assembly 201, an illumination lens 202, an aperture member 203, a blanking plate 204, a reducing lens 205, a limiting aperture member 206, an objective lens 207, a deflector 209, an astigmatic coil 211, and a detector 212. In the writing chamber 103, an XY stage 105 is arranged. On the XY stage 105, there is placed a target object or "sample" 101 such as a mask serving as a writing target substrate when writing is performed. For example, the target object 101 is an exposure mask used for manufacturing semiconductor devices, or is a semiconductor substrate (silicon wafer) on which semiconductor elements are formed. The target object 101 may be, for example, a mask blank on which resist has been applied and nothing has yet been written. Moreover, a mirror 210 for measuring the position of the XY stage 105 is arranged on the XY stage 105. The stage 105 includes an XY stage 107 that can move in the horizontal direction (x and y directions), and a Z stage 106 that can move in the vertical direction (z direction). In the case of FIG. 1, the Z stage 106 is placed on the XY stage 107.

The control unit 160 includes a control computer 110, a memory 112, a deflection control circuit 120, a DAC (digital-analog converter) amplifier unit 132, a coil control circuit 134, a lens control circuit 136, an amplifier 138, a stage position detector 139, and storage devices 140 and 142 such as magnetic disk drives. The control computer 110, the memory 112, the deflection control circuit 120, the coil control circuit 134, the lens control circuit 136, the amplifier 138, the stage position detector 139, and the storage devices 140 and 142 are connected with each other through a bus (not shown). Writing data is input into the storage device 140 (storage unit) from the outside, and stored therein. The DAC amplifier unit 132 is connected to the deflection control circuit 120 and the deflector 209. The coil control circuit 134 is connected to the astigmatic coil 211. The lens control circuit 136 is connected to the objective lens 207. The amplifier 138 is connected to the detector 212.

In the control computer 110, there are arranged a writing data processing unit 50, a writing control unit 52, a measurement unit 60, a 3σ distribution generation unit 62, a minimum (min) beam number calculation unit 64, a maximum (max) distortion measurement unit 66, a division number calculation unit 68, a setting unit 70, a setting unit 72, a measurement unit 74, a difference calculation unit 76, a determination unit 78, a division number change unit 80, a setting unit 82, a setting unit 84, and a determination unit 86. A set of units, such as the writing data processing unit 50, the writing control unit 52, measurement unit 60, 3σ distribution generation unit 62, minimum (min) beam number calculation unit 64, maximum (max) distortion measurement unit 66, division number calculation unit 68, setting unit 70, setting unit 72, measurement unit 74, difference calculation unit 76, determination unit 78, division number change unit 80, setting unit 82, setting unit 84, and determination unit 86 may be configured by at least one circuit such as at least one electric circuit, at least one computer, at least one processor, at least one circuit board, or at least one semiconductor device, etc., and may be executed by the at least one circuit. Data which is input and output to/from the writing data processing unit 50, the writing control unit 52, measurement unit 60, 3σ distribution generation unit 62, minimum (min) beam number calculation unit 64, maximum (max) distortion measurement unit 66, division number calculation unit 68, setting unit 70, setting unit 72, measurement unit 74, difference calculation unit 76, determination unit 78, division number change unit 80, setting unit 82, setting unit 84, and determination unit 86, and data being operated are stored in the memory 112 each time. When at least one of the writing data processing unit 50, the writing control unit 52, measurement unit 60, 3σ distribution generation unit 62, minimum (min) beam number calculation unit 64, maximum (max) distortion measurement unit 66, division number calculation unit 68, setting unit 70, setting unit 72, measurement unit 74, difference calculation unit 76, determination unit 78, division number change unit 80, setting unit 82, setting unit 84, and determination unit 86 is configured by software, a computer, such as a CPU or a GPU, is arranged in the control computer 110.

FIG. 1 shows a configuration necessary for explaining the first embodiment. Other configuration elements generally necessary for the writing apparatus 100 may also be included.

Figure 2:
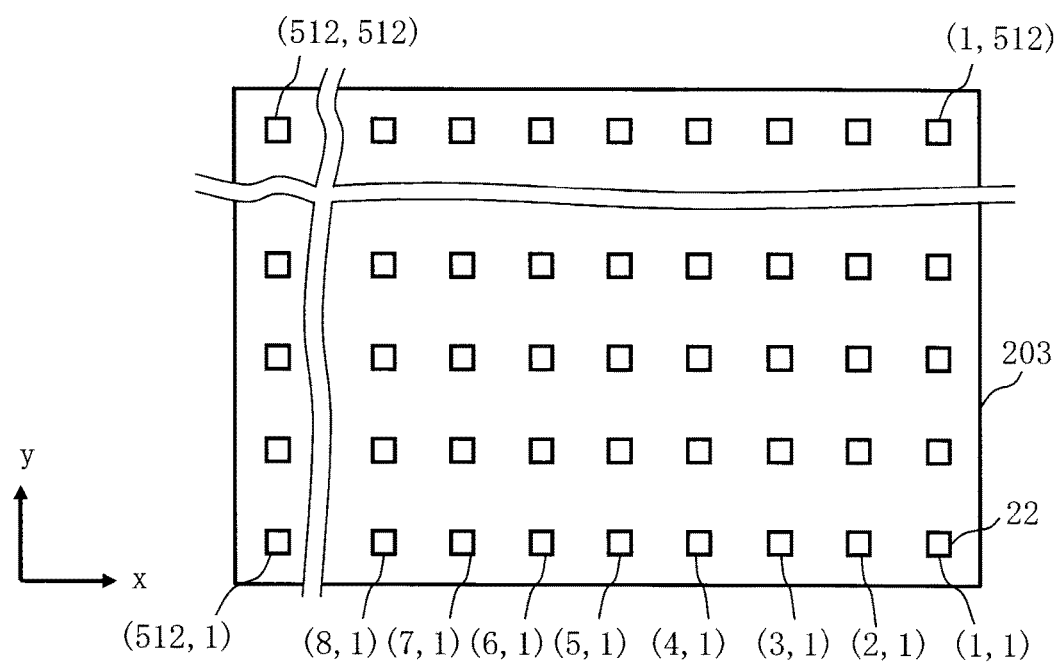
FIG. 2 is a conceptual diagram showing an example of the structure of an aperture member according to the first embodiment.

FIG. 2 is a conceptual diagram showing an example of the structure of an aperture member according to the first embodiment. In FIG. 2, holes (openings) 22 of m rows long (y direction) and n columns wide (x direction) (m≥2, n≥2) are formed, like a matrix, at a predetermined arrangement pitch in the aperture member 203. In FIG. 2, for example, holes 22 of 512 (rows)×512 (columns) are formed in the length and width (x and y) directions. Each of the holes 22 is a quadrangle of the same dimensional shape. Alternatively, each of the holes 22 can be a circle of the same circumference. Multi-beams 20 are formed by letting portions of an electron beam 200 respectively pass through a corresponding hole of a plurality of holes 22. The case in which the holes 22 of two or more rows and columns are arranged in the length and width (x and y) directions is shown here, but the arrangement is not limited thereto. For example, it is also acceptable that a plurality of holes 22 are arranged in only one row (x direction) or in only one column (y direction). That is, in the case of only one row, there are arranged a plurality of holes 22 as a plurality of columns, and in the case of only one column, there are arranged a plurality of holes 22 as a plurality of rows. Moreover, the method of arranging the holes 22 is not limited to the case of FIG. 2 where holes are arranged like a grid in the length and width directions. For example, with respect to the kth row and the (k+1)th row, which are arrayed in the length direction (y direction), each hole in the kth row and each hole in the (k+1)th row may be mutually displaced in the width direction (x direction) by a dimension "a". Similarly, each hole in the (k+1)th row and each hole in the (k+2)th row may be mutually displaced in the width direction (x direction) by a dimension "b", for example.

Figure 3:
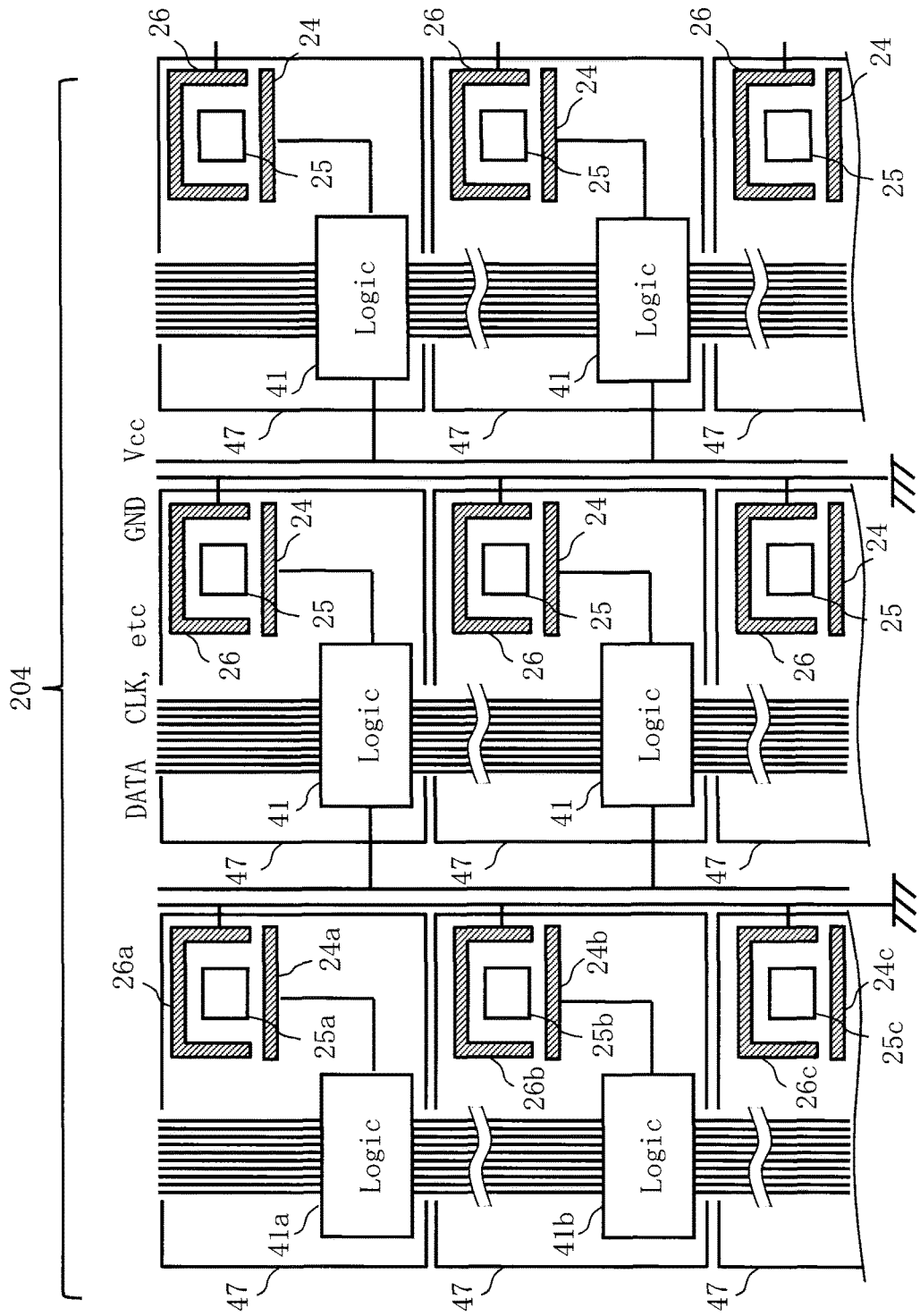
FIG. 3 is a top view conceptual diagram showing a part of a blanking plate according to the first embodiment.

FIG. 3 is a top view conceptual diagram showing a part of a blanking plate according to the first embodiment. In FIG. 3, the positional relation of electrodes 24 and 26 and the positional relation of a control circuit 41 are not in accordance with each other. In the blanking plate 204, as shown in FIG. 3, there are formed passage holes 25 (openings), through which multiple beams respectively pass, at the positions each corresponding to each hole 22 of the aperture member 203 of FIG. 2. Then, a pair of electrodes 24 and 26 (blanker: blanking deflector) for blanking deflection is arranged at the opposite sides of and close to each passage hole 25. Moreover, close to each passage hole 25, there is arranged a control circuit 41 (logic circuit) for applying a deflection voltage to, for example, the electrode 24 for each passage hole 25. The other one (the electrode 26, for example) of the two electrodes 24 and 26 for each beam is grounded (earthed). Further, for example, 10-bit parallel lines for control signals are connected to each control circuit 41. In addition to the 10-bit parallel lines, for example, a clock signal line and a power source line are connected to each control circuit 41. A part of the parallel lines may be used as the clock signal line and the power source line. A separate blanking system 47 composed of the electrodes 24 and 26 and the control circuit 41 is configured for each beam of multiple beams. A control signal for each control circuit 41 is output from the deflection control circuit 120. Moreover, a shift register (not shown) is arranged in each control circuit 41, and for example, shift registers for beams in one row of n×m multi beams in the control circuit are connected in series. For example, control signals for beams in one row of the n×m multi beams are transmitted in series. For example, a control signal of each beam is stored in a corresponding control circuit 41 by clock signals of n times.

The electron beam 20 passing through a corresponding passage hole is deflected by the voltage independently applied to the two electrodes 24 and 26 being a pair. Blanking control is performed by this deflection. Blanking deflection is performed for each corresponding beam of the multi-beams. Thus, a plurality of blankers respectively perform blanking deflection of a corresponding beam of the multi-beams having passed through a plurality of holes 22 (openings) of the aperture member 203.

Figure 4:
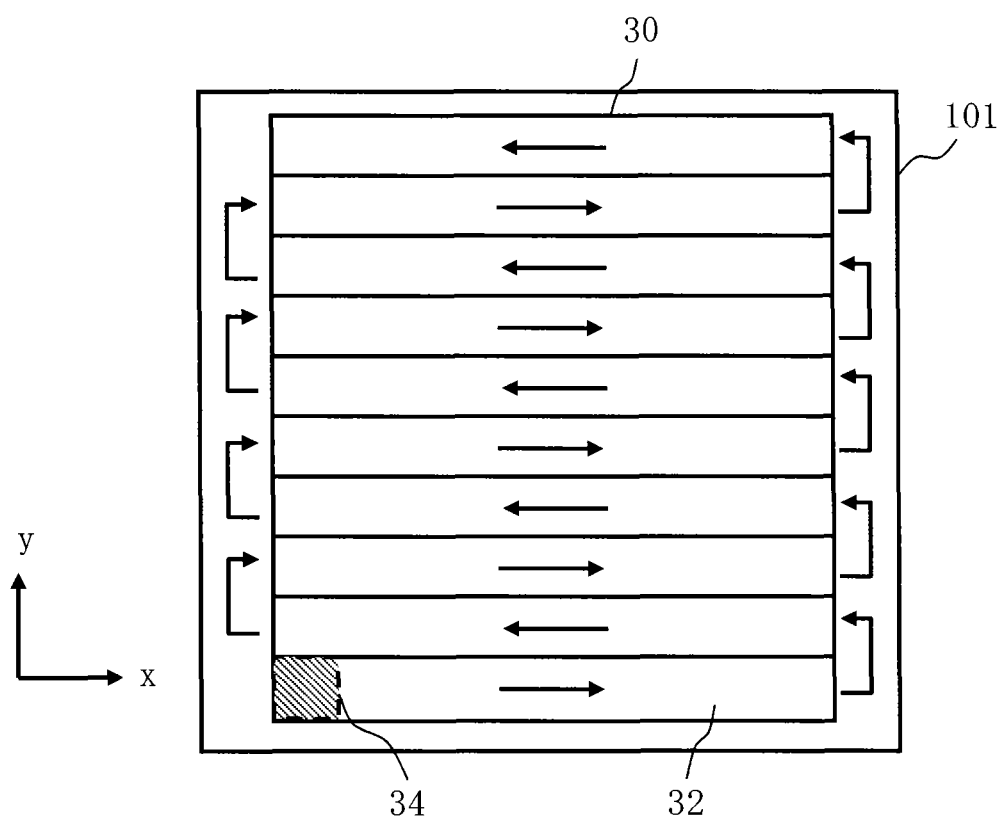
FIG. 4 is a conceptual diagram explaining an example of a writing operation according to the first embodiment.

FIG. 4 is a conceptual diagram explaining an example of a writing operation according to the first embodiment. As shown in FIG. 3, a writing region 30 of the target object 101 is virtually divided into a plurality of stripe regions 32 each in a strip shape and each having a predetermined width in the y direction, for example. Each of the stripe regions 32 serves as a unit region for writing. First, the XY stage 105 is moved to make an adjustment such that an irradiation region 34 which can be irradiated with one irradiation of the multi-beams 20 is located at the left end of the first stripe region 32 or at a position more left than the left end, and then writing is started. When writing the first stripe region 32, by moving the XY stage 105 in the −x direction, for example, the writing advances relatively in the x direction. The XY stage 105 is, for example, continuously moved at a predetermined speed. After writing the first stripe region 32, the stage position is moved in the −y direction to make an adjustment such that the irradiation region 34 is located at the right end of the second stripe region 32 or at a position more right than the right end to be relatively located in the y direction. Then, similarly, by moving the XY stage 105 in the x direction, for example, writing advances in the −x direction. That is, writing is performed while alternately changing the direction, such as performing writing in the x direction in the third stripe region 32, and in the −x direction in the fourth stripe region 32, and thus, the writing time can be reduced. However, the writing operation is not limited to the case of performing writing while alternately changing the direction, and it is also preferable to perform writing in the same direction when writing each stripe region 32. By one shot, a plurality of shot patterns whose number is equal, at the maximum, to the number of the holes 22 are formed at a time by multi-beams which have been formed by passing through respective corresponding holes 22 of the aperture member 203.

Writing processing is performed as described below. First, the writing data processing unit 50 reads writing data from the storage device 140, and performs a plurality of stages of data conversion processing to generate shot data. Shot data is generated for each pixel, and then, the writing time (irradiation time) is calculated. For example, when no pattern is formed in a target pixel, since no beam irradiation is performed, an identification code indicating writing time zero or no beam irradiation is defined. Here, the maximum writing time T (maximum exposure time) in one multi-beam shot is set in advance. It is preferable that the irradiation time of each beam to be actually applied is obtained in proportion to a calculated area density of a pattern. Moreover, it is preferable that the irradiation time of each beam to be finally calculated is a time period equivalent to an irradiation amount (dose) after correction in which a dimensional variation (not shown) occurred due to a phenomenon such as the proximity effect, the fogging effect result, and the loading effect has been corrected using an irradiation amount. Therefore, the irradiation time of each beam to be actually applied differs for each beam. The writing time (irradiation time) of each beam is obtained as a value within the maximum writing time T. Moreover, the writing data processing unit 50 generates, for each shot of multi-beams, irradiation time arrangement data in which calculated irradiation time data of each pixel is arranged, as data for a beam for writing each pixel, in order of arrangement of each beam of multi-beams. The generated irradiation time arrangement data is stored in the storage device 142.

The deflection control circuit 130 reads irradiation time arrangement data (shot data) from the storage device 142, and generates deflection amount data for deflecting multi-beams. The writing control unit 52 outputs a control signal for performing writing processing, to a control circuit (not shown) that drives the deflection control circuit 130 and the writing unit 150. Receiving the signal, the writing processing is started. The writing unit 150 writes a desired pattern on the target object 101 with multi-beams. Specifically, it operates as described below.

The electron beam 200 emitted from the electron gun assembly 201 (emitter) almost perpendicularly (e.g., vertically) illuminates the whole of the aperture member 203 by the illumination lens 202. A plurality of holes (openings) each being a quadrangle are formed in the aperture member 203. The region including all the plurality of holes is irradiated with the electron beam 200. For example, a plurality of quadrangular electron beams (multi-beams) 20a to 20e are formed by making portions of the electron beam 200 irradiating the positions of a plurality of holes pass through a corresponding hole of the plurality of holes of the aperture member 203 respectively. The multi-beams 20a to 20e respectively pass through corresponding blankers (first deflector: separate blanking system) of the blanking plate 204. Each blanker deflects (performs blanking deflection) a separately passing electron beam 20 to be beam ON during a calculated writing time (irradiation time) and to be beam "off" during the time period other than the calculated writing time.

The multi-beams 20a, 20b, . . . , 20e having passed through the blanking plate 204 are reduced by the reducing lens 205, and travel toward the hole in the center of the limiting aperture member 206. At this time, the electron beam 20 deflected to be beam "off" by the blanker of the blanking plate 204 deviates from the hole in the center of the limiting aperture member 206 (blanking aperture member) and is blocked by the limiting aperture member 206. On the other hand, the electron beam 20 which was not deflected by the blanker of the blanking plate 204 or was deflected to be beam "on" passes through the hole in the center of the limiting aperture member 206 as shown in FIG. 1. Blanking control is performed by on/off of the separate blanking system in order to control on/off of the beam. Thus, the limiting aperture member 206 blocks each beam which was deflected to be in the "off" state by the separate blanking system. One beam shot is formed by a beam which has been formed during from a beam "on" state to a beam "off" state and has passed through the limiting aperture member 206. The multi beams 20 having passed through the limiting aperture member 206 are focused by the objective lens 207 in order to be a pattern image of a desired reduction rate, and respective beams (the entire multi beams 20) having passed through the limiting aperture member 206 are collectively deflected in the same direction by the deflector 209 so as to irradiate respective writing positions (irradiation positions) on the target object 101. For example, while the XY stage 105 is continuously moving, tracking control is performed by the deflector 208 so that writing positions (irradiation positions) of beams may follow the movement of the XY stage 105. Ideally, multi beams 20 to irradiate at a time are aligned at pitches obtained by multiplying the arrangement pitch of a plurality of holes of the aperture member 203 by the desired reduction rate described above. The writing apparatus 100 executes a writing operation by a method that sequentially performs irradiation of a shot beam while shifting the writing position, and when writing a desired pattern, a beam needed according to a pattern is controlled to be beam "on" by blanking control.

As described above, since each beam position of multi-beams directly affects writing dimensions, it is important to accurately know the beam position of multi-beams in order to maintain the dimensional accuracy of multi-beam writing. However, since the amount of current per beam used for multi-beam writing is small and its signal strength is weak, the measurement accuracy decreases in measuring each beam, and therefore it is difficult to highly accurately measure each beam position of multi-beams. Even if a white noise indicating that measurement values vibrate up and down irregularly is reduced by increasing N, the number of times of measurement, with respect to each beam, and, for example, by obtaining a mean square value, the improvement stops at $\sqrt{N}$ times improvement and therefore, the improvement effect is limited. Moreover, there is also a problem in that, since the number of beams configuring multi-beams is very large, it takes a long time to measure positions of all the multi-beams. Furthermore, if the number of beams of multi-beams is increased, the measuring time also increases by the amount of the increased beam number. Therefore, according to the first embodiment, while regarding a beam group composed of beams that satisfy required measurement accuracy as one beam, beam positions are measured at measurement points whose number satisfies the required dimensional accuracy. Then, positions of multi-beams are known based on the beam position of each obtained measurement point. It will be described specifically below.

Figure 5:
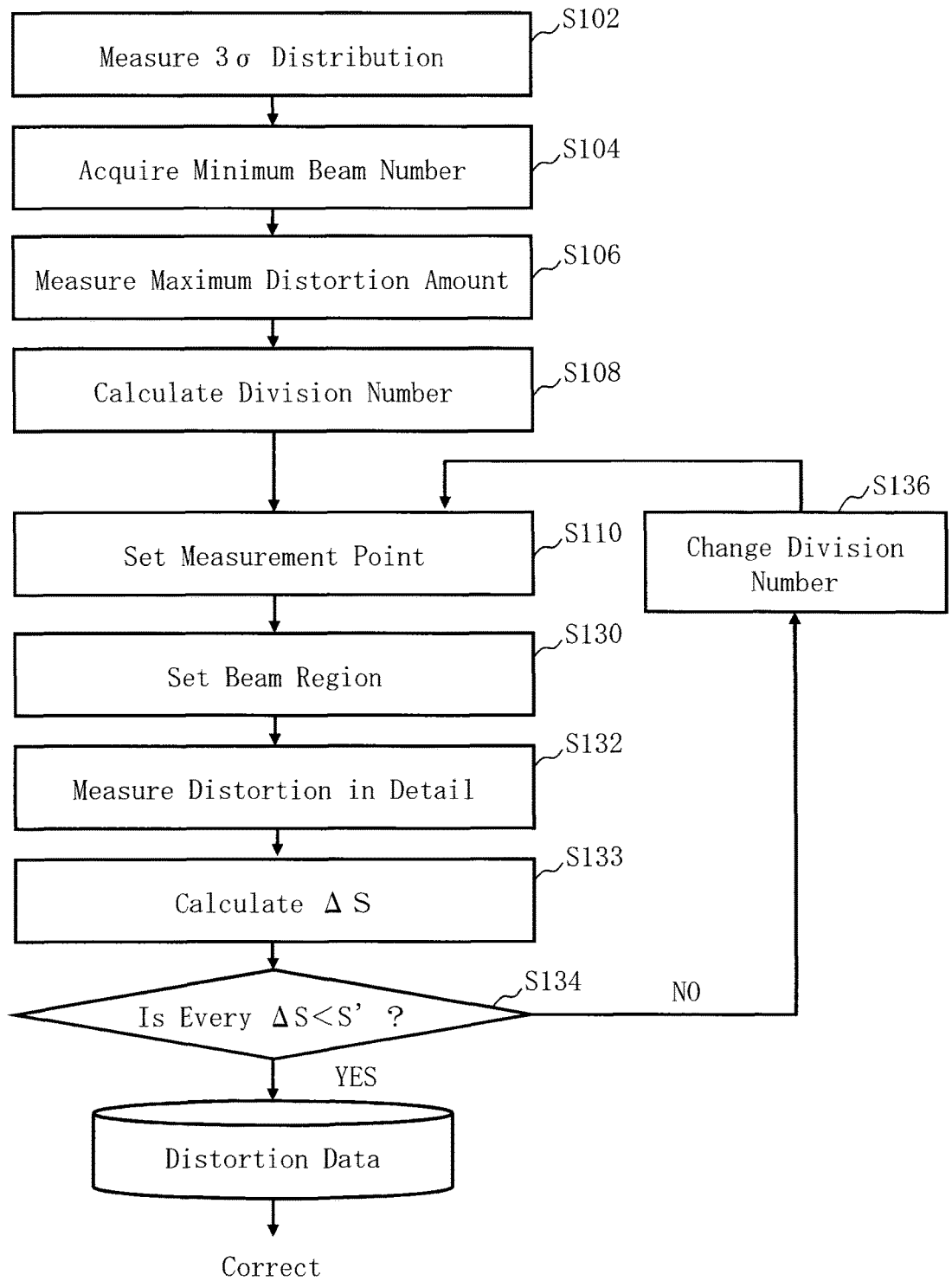
FIG. 5 is a flowchart showing main steps of a method of measuring beam positions of multi-beams according to the first embodiment.

FIG. 5 is a flowchart showing main steps of a method of measuring beam positions of multi-beams according to the first embodiment. In FIG. 5, the method of measuring beam positions of multi-beams of the first embodiment executes a series of steps: a 3σ measurement step (S102), a minimum beam number acquisition step (S104), a maximum distortion amount measurement step (S106), a division number calculation step (S108), a measurement point setting step (S110), a beam region setting step (S130), a detailed distortion measurement step (S132), a difference (Δ distortion amount difference) calculation step (S133), a determination step (S134), and a division number change step (S136).

In the 3σ measurement step (S102), while changing the number of beams, the measurement unit 60 scans a mark 108 with beams whose number is variably changed, with regarding the beams as one beam group, for each beam group of changed number beams, and detects a reflection electron or a secondary electron by the detector 212. Thereby, the amount of current of each beam group is measured. Scanning with a beam group should be performed by collectively deflecting the beam group by the deflector 209. As the beam group, a plurality of adjoining beams in multi-beams are used. Preferably, a plurality of beams composing a beam group are selected such that the shape of the irradiation region of the beam group is a quadrangle. For example, the central beam of multi-beams and a plurality of beams around the central beam are used. Outputs of the detector 212, after being converted to a digital signal from an analog signal and amplified by the amplifier 138, are output to the measurement unit 60. When changing the number of beams, k-time scanning (for example, 100 times) is performed, for each beam group of changed number beams, to measure the current amount. The 3σ distribution generation unit 62 calculates, for each beam group of changed number beams, the value of 3σ in a variation distribution (normal distribution) of results of the k-time measurement (current amount measurement results), where σ is a standard deviation, and a mean value±3σ is a variation including about 99.7% of measurement results. Next, the 3σ distribution generation unit 62 generates a 3σ distribution for each beam group of changed number beams.

Figure 6:
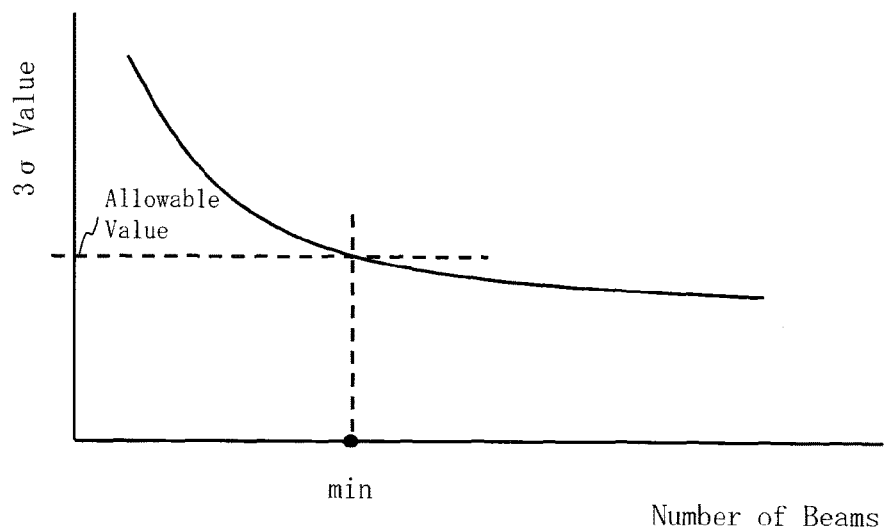
FIG. 6 shows an example of 3σ distribution according to the first embodiment.

FIG. 6 shows an example of 3σ distribution according to the first embodiment. In FIG. 6, the ordinate axis shows a value of 3σ, and the abscissa axis shows the number of beams.

As shown in FIG. 3, as the number of beams increases, 3σ (variation) decreases and finally converges. Thus, it turns out that although a measurement error is large and the measurement accuracy is low in the case of one beam, the measurement accuracy improves when the number of beams increases.

In the minimum beam number acquisition step (S104), the min. beam number calculation unit 64 (acquisition unit) acquires, by using 3σ distribution, the number of beams needed for 3σ indicating a measurement reproducibility of the current amount of multi-beams to be within the range of an allowable value. Here, a min. beam number (the minimum number of beams) should be acquired. Although it is preferable to acquire a min. beam number, it is not limited to the min. beam number. What is necessary is to be at least a min. beam number. Thus, the measurement reproducibility of the current amount is determined using the value of 3σ of a current amount distribution in which the current amount has been measured a plurality of times. Thereby, the number of beams that satisfies the measurement accuracy and that is needed for measuring a positional deviation amount (distortion amount) of a beam can be acquired.

In the maximum distortion amount measurement step (S106), the max distortion measurement unit 66 measures a maximum distortion amount of the shape of an irradiation region which is irradiated with the whole of multi-beams. The maximum distortion amount of the shape of the irradiation region irradiated with the whole of the multi-beams is measured by using beam groups, each being composed of min. number beams, that irradiate the four corner positions and the center position of the irradiation region.

Figure 7:
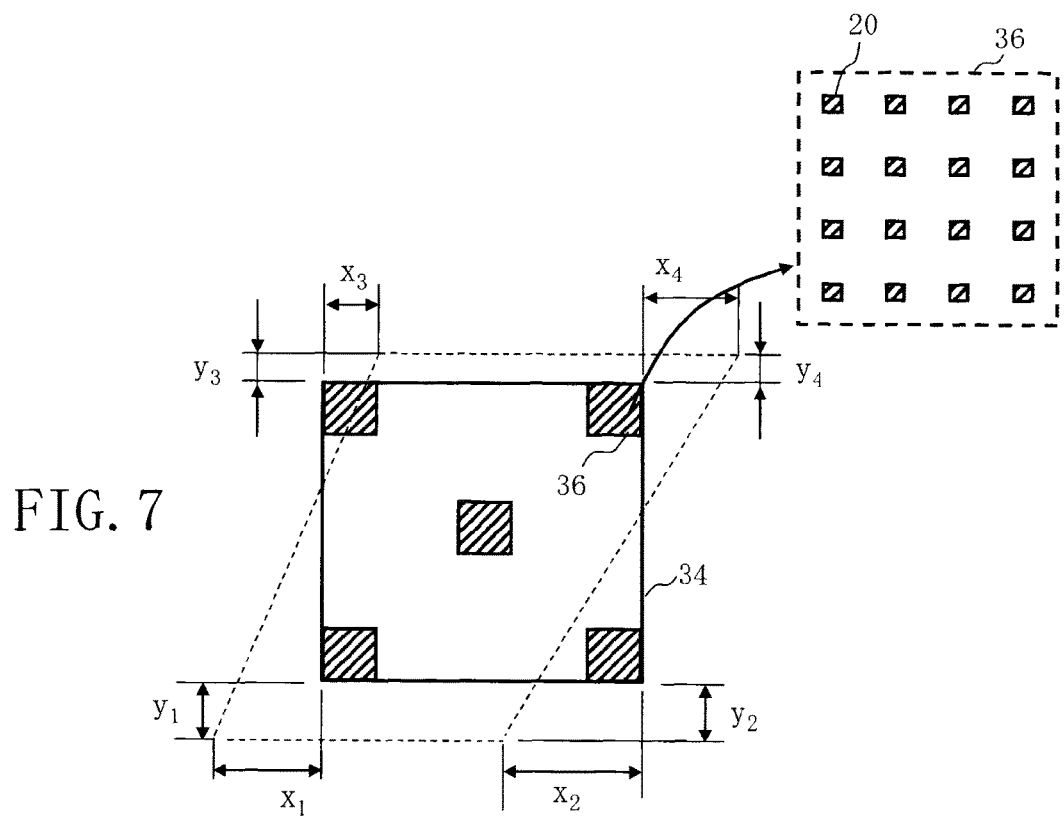
FIG. 7 shows an example of a beam group used for measuring a maximum distortion according to the first embodiment.

FIG. 7 shows an example of a beam group used for measuring a maximum distortion according to the first embodiment. As shown in FIG. 7, the design shape (ideal shape: solid line) of the irradiation region 34 irradiated with the whole of the multi-beams is a quadrangle. However, the shape (dotted line) of the irradiation region 34 becomes distorted when deviation of a beam irradiation position occurs. The maximum distortion occurs at the four corner positions of the irradiation region 34. Therefore, the positional deviation amount (distortion amount) of a beam at each of the four corners is measured. Since the center position is hard to produce a positional deviation, or even if produced, it is a small amount, the relative positional relation between a measurement result of the four corner positions and a design position can be highly accurately adjusted by measuring a beam position at the center and having a position adjustment in accordance with a design position. Therefore, the positional deviation amounts at the four corners can be measured highly accurately. Each of the beam groups at the four corners is composed of min. beam number of beams including the beam at the corner concerned. In FIG. 7, the region irradiated by the beam group is shown as a beam region 36. The measurement is performed such that the beam group at each position scans the mark 108, and the detector 212 detects a reflection electron or a secondary electron. Thereby, the position of each beam group is measured. As the position of each beam group, the center of gravity position of the beam region 36 for which the position of the beam group concerned is measured is used. Therefore, with respect also to design four corner positions, a positional deviation amount from the design corner position can be calculated by using a corresponding gravity center position. In the example of FIG. 7, the positional deviation amount at the lower left is expressed by $x_1$ and $y_1$, that at the lower right is by $x_2$ and $y_2$, that at the upper left is by $x_3$ and $y_3$, and that at the upper right is by $x_4$ and $y_4$. Thereby, the maximum distortion amount can be measured in the x direction and the y direction, respectively.

In the first embodiment, it is requested to measure positions of multi-beams at a high speed. Therefore, the measurement is performed at a minimum required number of positions, and thus, needed measurement points are obtained.

In the division number calculation step (S108), the division number calculation unit 68 calculates a value A, as a division number, by dividing a maximum distortion amount of the shape of an irradiation region by a desired dimensional accuracy value. For example, if the maximum distortion amount is 5 nm and the dimensional accuracy required for the writing accuracy is 0.2 nm, A=5/0.2=25. That is, the division number is 25. Thereby, the irradiation region 34 which is irradiated with the whole of the multi-beams should be divided by 25×25. In this way, according to the first embodiment, the division number of a region is set depending on the maximum distortion amount. When a beam position can be measured in each of a plurality of divided division regions, theoretically a position measurement result of multi-beams satisfying the writing accuracy can be obtained.

In the measurement point setting step (S110), the setting unit 70 sets a plurality of measurement points depending on a desired dimensional accuracy value, for the irradiation region 34 which is irradiated with the whole of the multi-beams. The setting unit 70, including a division processing unit (not shown), divides the irradiation region 34 by an obtained division number into a plurality of division regions by using the division processing unit.

Figure 8:
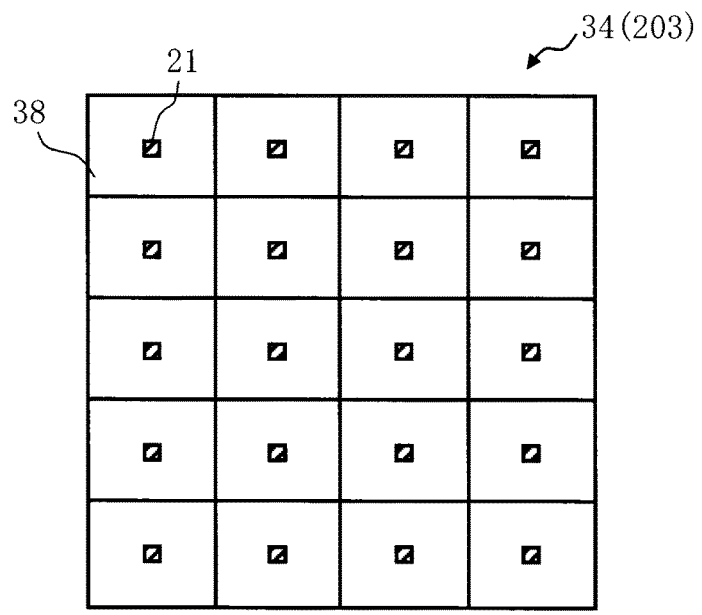
FIG. 8 shows an example of a measurement point according to the first embodiment.

FIG. 8 shows an example of a measurement point according to the first embodiment. FIG. 8 shows a plurality of quadrangular division regions 38 obtained by dividing the irradiation region 34 by a calculated division number. Then, the setting unit 70, including a gravity center calculation unit (not shown), calculates the center of gravity position of each of a plurality of division regions 38 by using the gravity center calculation unit. The setting unit 70 sets, as a measurement point, the position at the center of gravity position of each of a plurality of division regions 38 or the position of a nearest beam 21. Thereby, theoretically, a plurality of measurement points of multi-beams satisfying the writing accuracy can be obtained.

In the beam region setting step (S130), for each measurement point of a plurality of measurement points, the setting unit 72 sets a beam region, including a measurement point, irradiated with a plurality of beams (beam group) whose number is a min. beam number in multi-beams.

Figure 9:
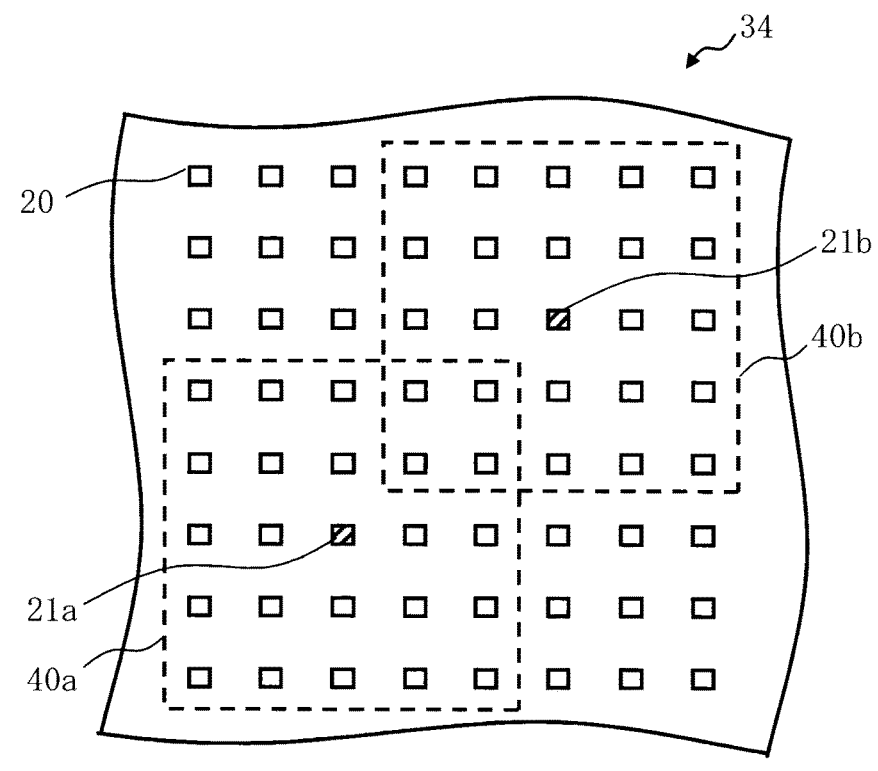
FIG. 9 shows an example of a beam region according to the first embodiment.

FIG. 9 shows an example of a beam region according to the first embodiment. As described above, a beam group composed of min. number beams is necessary for obtaining the measurement reproducibility. Then, for each measurement point, the setting unit 72 sets a beam region 40 which can be irradiated by a beam 21 at the measurement point and its circumferential beams, while regarding the beam 21 as the center of gravity position. In that case, a part of the beam regions 40 (beam region 40a and beam region 40b) may be overlapped with each other as shown in FIG. 9. In other words, when measuring the position of the beam region 40, a beam having been used for measuring the position of other beam region 40 may be redundantly used. Moreover, when measuring positions of multi-beams, it is preferable to select each beam such that the beam region 40 is a quadrangle configured by the same number of beams aligned in the x and y directions.

In the detailed distortion measurement step (S132), the measurement unit 74 measures, for each measurement point, the position of a measurement point concerned by scanning the mark 108 with a plurality of beams (beam group) for a corresponding beam region 40.

Figure 10A:
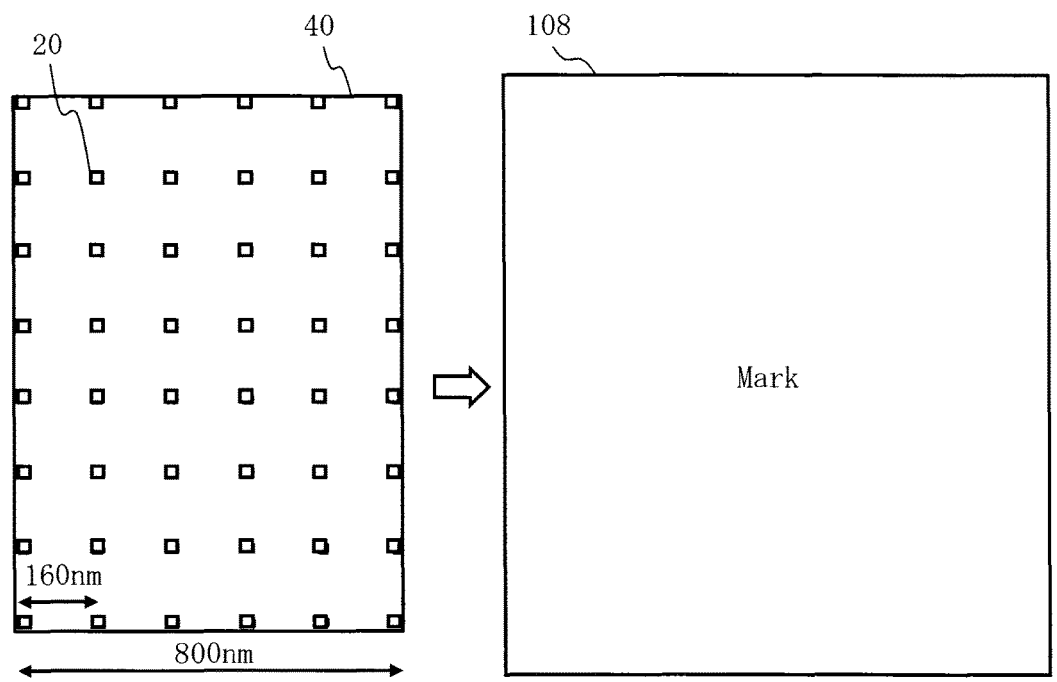
FIGS. 10A and 10B illustrate beam scanning according to the first embodiment.
Figure 10B:
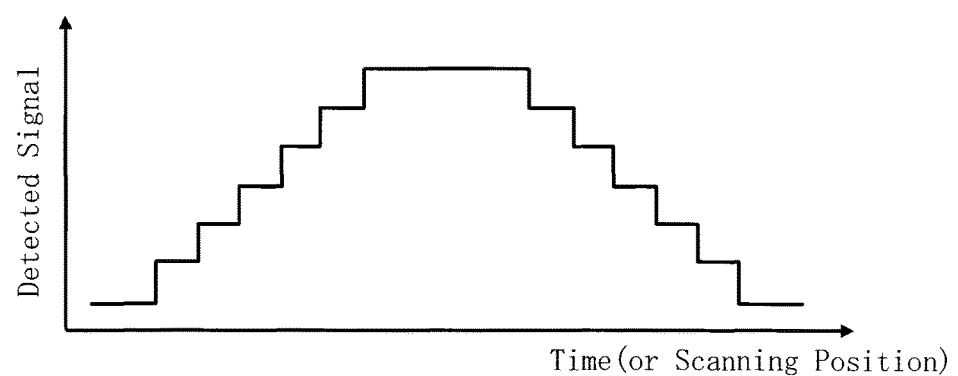

FIGS. 10A and 10B illustrate beam scanning according to the first embodiment. As shown in FIG. 10A, the measurement is performed such that the beam group of each beam region 40 scans the mark 108, and the detector 212 detects a reflection electron or a secondary electron. The output of the detector 212 is amplified by the amplifier 138 after being converted to a digital signal from an analog signal, and is output to the measurement unit 74. Concerning the detection result, as shown in FIG. 10B, every time each beam column of a beam group reaches the mark 108, the detection value increases in a step-by-step manner, and every time it secedes from on the mark 108, the detection value decreases in a step-by-step manner. In addition, the mark 108 is preferably formed to be larger than the beam region 40. By this, there is no beam that misses the mark 108 when scanning. The position of each beam group is measured by detection through scanning. As the position of each beam group, the center of gravity position of the region concerning which detection for the beam group concerned is performed is used. Since the beam 21 at the measurement point is fitted in the center of gravity position of the beam region 40, it is possible to measure positions of the beams 21 at a plurality of measurement points by performing the measurement described above. The measurement unit 74, including a distortion amount calculation unit (not shown), calculates a positional deviation amount (distortion amount) deviated from the design position corresponding to each of a plurality of measurement points by using the distortion amount calculation unit.

In the difference ΔS (Δ distortion amount difference) calculation step (S133), the difference calculation unit 76 calculates a distortion amount difference ΔS (Δ distortion amount difference) between adjoining measurement points by using each of obtained distortion amounts at all the measurement points.

In the determination step (S134), the determination unit 78 determines whether each of all the distortion amount differences ΔS (Δ distortion amount differences) between adjoining measurement points is within a threshold value S'. Preferably, the desired dimensional accuracy value described above is used as the threshold value. When every Δ distortion amount difference between adjoining measurement points is within a threshold value, data on a distortion amount measured at each measurement point is output to the storage device 142. When not every Δ distortion amount difference between adjoining measurement points is within a threshold value, it proceeds to the division number change step (S136). If, as described above, a plurality of measurement points of a plurality of division regions 38 obtained by dividing the irradiation region 34 by a division number which is a value obtained by dividing a maximum distortion amount of the shape of an irradiation region by a desired dimensional accuracy value are used, theoretically positions of multi-beams satisfying the writing accuracy can be measured. However, there may be a case in which a part of the Δ distortion amount differences deviates from the theory. In such a case, since the dimensional accuracy satisfying the writing accuracy has not been acquired, it is necessary to redefine the division number.

In the division number change step (S136), when not every distortion amount difference between adjoining measurement points is within a threshold value, the division number change unit 80 changes the division number by using a value B obtained by dividing a distortion amount difference which is not within the threshold value by a desired dimensional accuracy value. If the value B includes a decimal point, it is preferable to round up the value to an integer. Specifically, a value obtained by multiplying the division number by the value B should be a new division number. Since the value B is an integral value greater than 1, the value of the division number becomes larger. In other words, a division region can be made smaller. Then, returning to the measurement point setting step (S110), each step from the measurement point setting step (S110) to the determination step (S134) is repeated until every Δ distortion amount difference between adjoining measurement points becomes within the threshold value in the determination step (S134). Usually, if repeated once, the determination step (S134) is fulfilled. By the above-described process, positions of multi-beams satisfying the writing accuracy can be measured using a minimum required number of measurement points. Therefore, the measuring time can be reduced. Each beam position in the irradiation region 34 can be obtained by performing a polynomial approximation using beam position data (x, y) of a plurality of measurement points. Then, the irradiation position shape (irradiation sensitivity) of multi-beams and/or the multi-beam shape formed by the aperture member 203 can be obtained by using the beam position at each measurement point.

According to the first embodiment, as described above, beam positions of multi-beams can be measured at a high speed while satisfying the required measurement accuracy and dimensional accuracy.

Then, a positional deviation amount of the writing position of multi-beams can be corrected by adjusting the dose, for example, of each beam by using obtained positions (distortion data) of the multi-beams. The method of correcting a positional deviation may be the same as the conventional method.

Moreover, in the detailed distortion measurement step (S132), a positional deviation amount at each measurement point can be measured by moving the mark 108 to the position of the measurement point by moving the stage 105. Further, if the measurement is performed by moving the stage 105 such that the mark 108 is at the central position of multi-beams, a positional deviation amount depending on deflection sensitivity by the deflector 108 can be measured.

Although, in the example described above, the case in which, in the beam region setting step (S130), each beam is selected so that the beam region 40 may be a quadrangle configured by the same number of beams aligned in the x and y directions has been described, it is not limited thereto. For example, if scanning the mark 108 with a beam group is performed in the x direction, the number of beams simultaneously located on the mark 108 can be increased by reducing the number of beam columns, where the columns are arrayed in the x direction, and increasing the number of beam rows, where the rows are arrayed in the y direction, for compensating the reduced amount of the beam column. Therefore, the current amount detected simultaneously can be increased. Similarly, if scanning is performed in the y direction, the number of beams simultaneously located on the mark 108 can be increased by reducing the number of beam rows, where the rows are arrayed in the y direction, and increasing the number of beam columns, where the columns are arrayed in the x direction, for compensating the reduced amount of the beam row. Therefore, the current amount detected simultaneously can be increased. Thus, as long as the beam 21 of the measurement point is arranged at the center of gravity position, beams configuring a beam group may be changed depending on the scanning direction and the like.

Moreover, as described above, for example, since positions of multi-beams satisfying the writing accuracy can be measured by position measurement at a minimum required number of measurement points by using a beam group of a minimum required number of beams, an astigmatic adjustment can also be performed highly accurately using this technique. The method of performing the astigmatic adjustment of the writing apparatus 100 is now described below.

Figure 11:
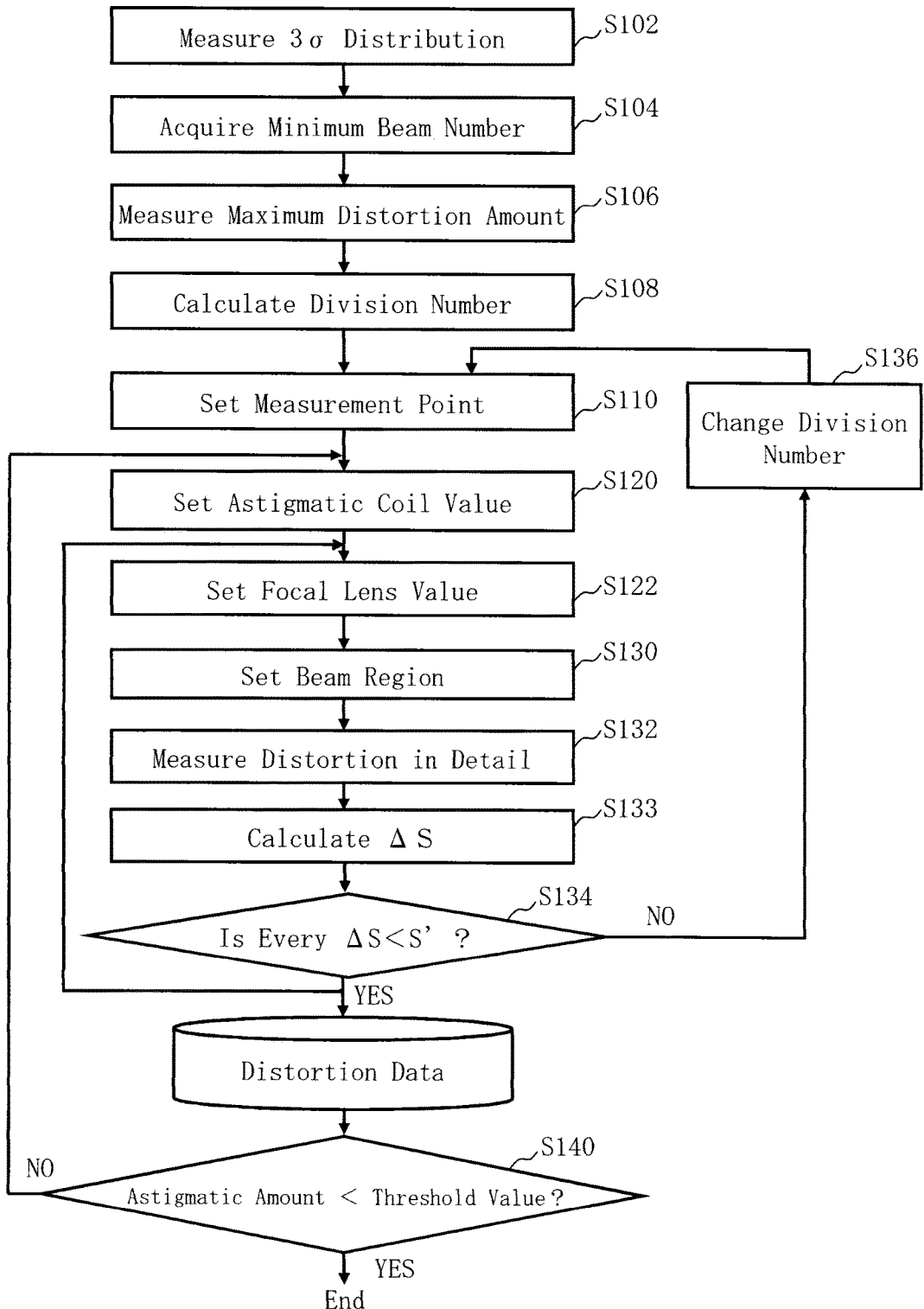
FIG. 11 is a flowchart showing main steps of a method of an astigmatic adjustment using a beam position measurement method of multi-beams according to the first embodiment.

FIG. 11 is a flowchart showing main steps of a method of an astigmatic adjustment using a beam position measurement method of multi-beams according to the first embodiment. In FIG. 11, the method of an astigmatic adjustment using the beam position measurement method of multi-beams of the first embodiment executes a series of steps: a 3σ measurement step (S102), a minimum beam number acquisition step (S104), a maximum distortion amount measurement step (S106), a division number calculation step (S108), a measurement point setting step (S110), an astigmatic coil value setting step (S120), a focal lens value setting step (S122), a beam region setting step (S130), a detailed distortion measurement step (S132), a difference (Δ distortion amount difference) calculation step (S133), a determination step (S134), a division number change step (S136), and a determination step (S140). FIG. 11 is the same as FIG. 5 except that the astigmatic coil value setting step (S120) and the focal lens value setting step (S122) are added between the measurement point setting step (S110) and the beam region setting step (S130), and the determination step (S140) is added after the determination step (S134). The astigmatic coil value setting step (S120) and the focal lens value setting step (S122) may be added between the beam region setting step (S130) and the detailed distortion measurement step (S132), or before the measurement point setting step (S110).

The contents of each step from the 3σ measurement step (S102) to the measurement point setting step (S110) are what has been described above.

In the astigmatic coil value setting step (S120), setting unit 82 sets an excitation value (astigmatic coil value) in the coil control circuit 134 in order to excite the astigmatic coil 211. As the excitation value, a plurality of values within a pre-set range are variably set to be described later. Here, one of a plurality of the values (for example, a smallest value) is set.

In the focal lens value setting step (S122), the setting unit 84 sets an excitation value (lens value) in the lens control circuit 136 in order to excite the objective lens 207. As the excitation value, a plurality of values within a pre-set range are variably set to be described later. For example, preparing an excitation value 1 based on which the focal position exists on the −Z side, and an excitation value 2 based on which the focal position exists on the +Z side, here, the excitation value 1 is set.

The contents of each step from the beam region setting step (S130) to the division number change step (S136) are what has been described above. Therefore, in the determination step (S134), each step from the measurement point setting step (S110) to the determination step (S134), including the astigmatic coil value setting step (S120) and the focal lens value setting step (S122), is repeated until every Δ distortion amount difference between adjoining measurement points is within a threshold value. Then, returning to the focal lens value setting step (S122), the setting unit 84 sets a next excitation value (lens value) in a plurality of excitation values in the lens control circuit 136 in order to excite the objective lens 207. Here, the excitation value 2 is set. Then, the beam region setting step (S130) and the detailed distortion measurement step (S132) are performed.

As described above, while the astigmatic coil value is set as a certain value, it is possible to obtain the irradiation position shape of multi-beams in the state where the excitation value 1 based on which the focal position exists on the −Z side is set, and the irradiation position shape of multi-beams in the state where the excitation value 2 based on which the focal position exists on the +Z side is set.

In the determination step (S140), the determination unit 86 calculates an astigmatic value, and determines whether the astigmatic value is smaller than a threshold value.

When the astigmatic value is not smaller than the threshold value, it returns to the astigmatic coil value setting step (S120), and each step from the astigmatic coil value setting step (S120) to the determination step (S140) is repeated until the astigmatic value becomes smaller than the threshold value in the determination step (S140).

Figure 12A:
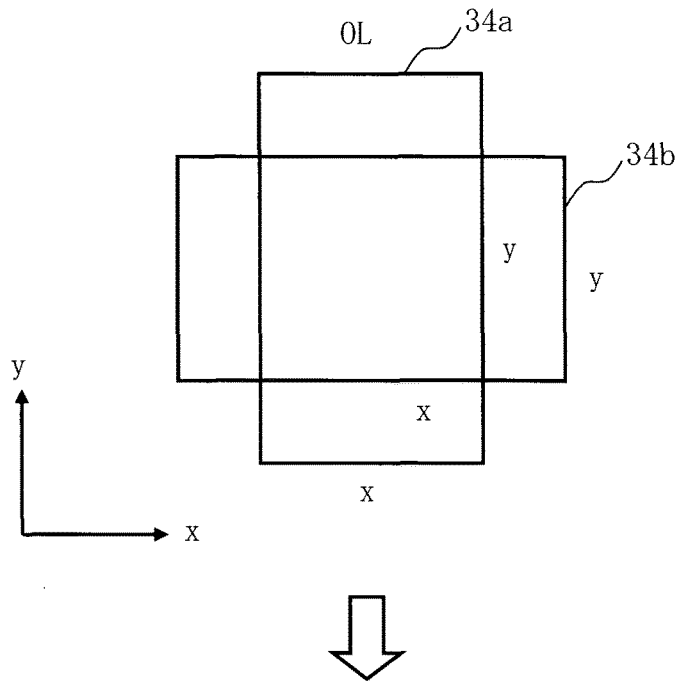
FIGS. 12A to 12C illustrate a method of an astigmatic adjustment of multi-beams according to the first embodiment.
Figure 12B:
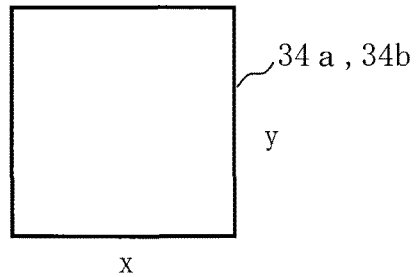
Figure 12C:
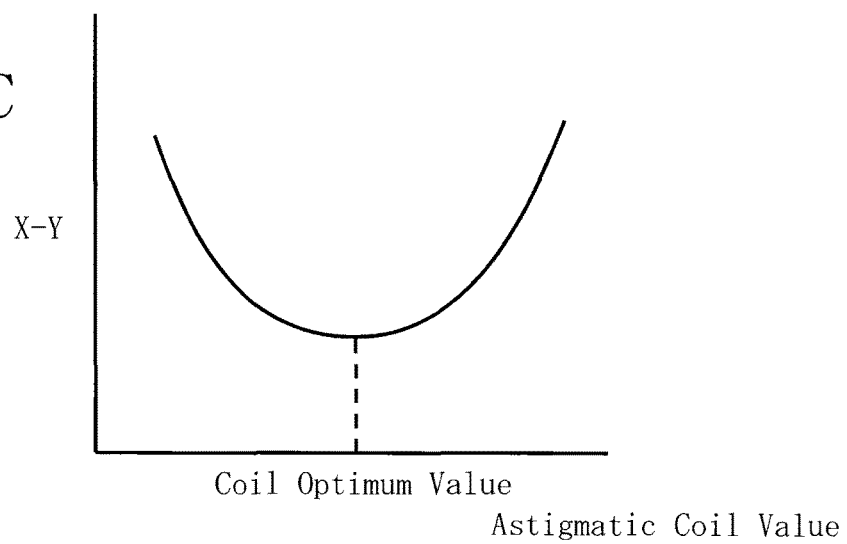

FIGS. 12A to 12C illustrate a method of an astigmatic adjustment of multi-beams according to the first embodiment. As shown in FIG. 12A, when the astigmatic coil value is set once, there are obtained the shape of an irradiation position 34a of multi-beams in the state where the excitation value 1 based on which the focal position exists on the −Z side is set, and the shape of an irradiation position 34b of multi-beams in the state where the excitation value 2 based on which the focal position exists on the +Z side is set. The irradiation position 34a is, for example, a quadrangle whose y-direction length is longer than x-direction length, and the irradiation position 34b is, for example, a quadrangle whose x-direction length is longer than y-direction length. In the state where the astigmatic coil value is not suitable, as shown in FIG. 12A, the shape of the irradiation position 34a and the shape of the irradiation position 34b do not conform with each other. By contrast, in the state where the astigmatic coil value is suitable, as shown in FIG. 12B, the shape of the irradiation position 34a and the shape of the irradiation position 34b conform with each other, or approach the conformation. It is preferable that the astigmatic is adjusted to an astigmatic coil value of in the case in which the difference between a distortion amount in the x direction and a distortion amount in the y direction becomes the smallest as shown in FIG. 12C.

After the division number and the measurement point are once set such that every Δ distortion amount difference between adjoining measurement points is within a threshold value in the determination step (S134), even if the set value is changed in the astigmatic coil value setting step (S120) and the focal lens value setting step (S122), it is presumed that the Δ distortion amount difference can be within a threshold value. Therefore, in the repeat step after the division number and the measurement point are once set such that every Δ distortion amount difference between adjoining measurement points is within a threshold value in the determination step (S134), the Δ distortion amount difference calculation step (S133), the determination step (S134), and the division number change step (S136) may be omitted.

By the above-described process, an astigmatic adjustment can be performed at minimum required number of measurement points at which positions of multi-beams satisfying the writing accuracy can be performed. Therefore, the measuring time can be reduced.

Referring to specific examples, embodiments have been described above. However, the present invention is not limited to these examples. For example, the number of measurement points, and further, the division number are not limited to the minimum values. They may be larger than the minimum values. For example, if the position of each beam in the irradiation region 34 is approximated by a third or higher order polynomial, since the number of unknown coefficients is ten or more, measurement values at ten or more positions are needed. In that case, even when the minimum value of the division number is less than ten, measurement points are preferably set by a division number of ten or more.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

Any other method of measuring beam positions of multi charged particle beams, and any other multi charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of measuring beam positions of multi charged particle beams comprising:
   acquiring a number of beams of multi charged particle beams, needed for a measurement reproducibility of a current amount to be within a range of an allowable value;
   setting a plurality of measurement points depending on a desired dimensional accuracy value, in an irradiation region irradiated with a whole of the multi charged particle beams;
   setting, for each of the plurality of measurement points, a beam region, including a measurement point of the plurality of measurement points, irradiated by a plurality of beams whose number is the number of beams needed for the measurement reproducibility in the multi charged particle beams; and
   measuring, for the each of the plurality of measurement points, a position of a measurement point concerned in the plurality of measurement points by using the plurality of beams of a corresponding beam region.

2. The method according to claim 1, further comprising:
   calculating a value, as a division number, by dividing a maximum distortion amount of a shape of the irradiation region by the desired dimensional accuracy value, wherein the setting the plurality of measurement points includes
      dividing the irradiation region by the division number into a plurality of division regions, and
      calculating a gravity center position of each of the plurality of division regions, as one of the plurality of measurement points.

3. The method according to claim 1, wherein the measurement reproducibility of the current amount is determined using a value of 3σ of a current amount distribution in which the current amount has been measured a plurality of times.

4. The method according to claim 1, wherein a maximum distortion amount of a shape of the irradiation region is measured using four corner positions and a center position of the irradiation region.

5. The method according to claim 1, further comprising:
   determining whether every distortion amount difference between adjoining measurement points is within a threshold value; and
   changing, when not the every distortion amount difference between adjoining measurement points is within the threshold value, the division number by using a value obtained by dividing a distortion amount difference which is not within the threshold value by the desired dimensional accuracy value.

6. The method according to claim 1, further comprising:
   measuring, while changing a number of beams, a current amount of each beam group composed of the beams whose number is variably changed, for the each beam group of changed number beams.

7. The method according to claim 6, wherein, in the measuring the current amount of the each beam group, the current amount is measured a plurality of times for the each beam group.

8. The method according to claim 7, further comprising:
   calculating a value of 3σ of a measured current amount distribution, for the each beam group.

9. A multi charged particle beam writing apparatus comprising:
   a stage configured to mount a target object thereon and to be continuously movable;
   an emitter configured to emit a charged particle beam;
   an aperture member, in which a plurality of openings are formed, configured to form multiple beams by letting a region including a whole of the plurality of openings be irradiated with the charged particle beam and letting portions of the charged particle beam respectively pass through a corresponding opening of the plurality of openings;
   a blanking plate in which there are arranged a plurality of blankers configured to respectively perform blanking deflection for a corresponding beam of the multiple beams having passed through the plurality of openings of the aperture member;
   a blanking aperture member configured to block each beam having been deflected to be in an "off" state by at least one of the plurality of blankers; and
   a computer configured to perform the functions of
      an acquisition processor configured to acquire a number of beams needed for a measurement reproducibility of a current amount of multi charged particle beams to be within a range of an allowable value,
      a measurement point setting processor configured to set a plurality of measurement points depending on a desired dimensional accuracy value, in an irradiation region irradiated with a whole of the multi charged particle beams,
      a beam region setting processor configured to set, for each of the plurality of measurement points, a beam region, including a measurement point of the plurality of measurement points, configured by a plurality of beams whose number is the number of beams needed for the measurement reproducibility in the multi charged particle beams, and a measurement processor configured to measure, for the each of the plurality of measurement points, a position of a measurement point concerned in the plurality of measurement points by using the plurality of beams of a corresponding beam region.

10. The apparatus according to claim 9, wherein the computer is further configured to perform functions of:

a division number calculation processor to calculate a value, as a division number, by dividing a maximum distortion amount of a shape of the irradiation region by the desired dimensional accuracy value, wherein the measurement point setting processor divides the irradiation region by the division number into a plurality of division regions, and calculates a gravity center position of each of the plurality of division regions, as one of the plurality of measurement points.

* * * * *